(12) United States Patent
Furutani et al.

(10) Patent No.: US 6,542,422 B1
(45) Date of Patent: Apr. 1, 2003

(54) SEMICONDUCTOR MEMORY DEVICE PERFORMING HIGH SPEED COINCIDENCE COMPARISON OPERATION WITH DEFECTIVE MEMORY CELL ADDRESS

(75) Inventors: Kiyohiro Furutani, Hyogo (JP); Takeshi Hamamoto, Hyogo (JP); Takashi Kubo, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/246,455

(22) Filed: Sep. 19, 2002

(30) Foreign Application Priority Data

Apr. 8, 2002 (JP) ........................................ 2002-105369

(51) Int. Cl.[7] ................................................ G11C 7/00
(52) U.S. Cl. .................................. 365/200; 365/189.07
(58) Field of Search ............................. 365/200, 189.07

(56) References Cited

U.S. PATENT DOCUMENTS

| | | | | |
|---|---|---|---|---|
| 5,485,425 A | * | 1/1996 | Iwai et al. .................. | 365/200 |
| 5,598,373 A | * | 1/1997 | Wada et al. ............ | 365/230.03 |
| 6,324,104 B1 | * | 11/2001 | Matsui ........................ | 365/200 |
| 6,331,958 B2 | * | 12/2001 | Tsukude ...................... | 365/201 |
| 6,335,884 B1 | * | 1/2002 | Kajigaya et al. ........ | 365/189.02 |
| 6,407,950 B2 | * | 6/2002 | Ooishi .................... | 365/189.01 |
| 6,445,602 B1 | * | 9/2002 | Kokudo et al. ................ | 365/45 |

FOREIGN PATENT DOCUMENTS

JP    10-3798    1/1998

* cited by examiner

*Primary Examiner*—Michael S. Lebentritt
*Assistant Examiner*—Tuan T. Nguyen
(74) *Attorney, Agent, or Firm*—McDermott, Will & Emery

(57) ABSTRACT

When an inputted column address CA and a defect address are compared with each other, an preset defect address and a defect conversion address obtained by inverse conversion of the defect address are both inputted to a comparison circuit. In the comparison circuit, coincidence determination operations are performed being switched between when address conversion is applied to the column address CA and when no address conversion is applied thereto, thereby coincidence comparison can be effected without using the column address CA after an address conversion operation; therefore, a delay in a determination operation accompanying a conversion operation is canceled to perform high speed data reading.

5 Claims, 10 Drawing Sheets

FIG.9 PRIOR ART

BURST LENGTH=2

| | CA<br><0> | | CAE<br><0> | | CAO<br><0> |
|---|---|---|---|---|---|
| 0# | 0 | 0# | 0 | 1# | 1 |
| 1# | 1 | 0# | 0 | 1# | 1 |

FIG.10 PRIOR ART

BURST LENGTH=4

| | CA<br><1><0> | | | CAE<br><1><0> | | | CAO<br><1><0> | |
|---|---|---|---|---|---|---|---|---|
| 0# | 0 | 0 | 0# | 0 | 0 | 1# | 0 | 1 |
| 1# | 0 | 1 | 2# | 1 | 0 | 1# | 0 | 1 |
| 2# | 1 | 0 | 2# | 1 | 0 | 3# | 1 | 1 |
| 3# | 1 | 1 | 0# | 0 | 0 | 3# | 1 | 1 |

FIG.11 PRIOR ART

BURST LENGTH=8

| | CA<br><2><1><0> | | | | CAE<br><2><1><0> | | | | CAO<br><2><1><0> | | |
|---|---|---|---|---|---|---|---|---|---|---|---|
| 0# | 0 | 0 | 0 | 0# | 0 | 0 | 0 | 1# | 0 | 0 | 1 |
| 1# | 0 | 0 | 1 | 2# | 0 | 1 | 0 | 1# | 0 | 0 | 1 |
| 2# | 0 | 1 | 0 | 2# | 0 | 1 | 0 | 3# | 0 | 1 | 1 |
| 3# | 0 | 1 | 1 | 4# | 1 | 0 | 0 | 3# | 0 | 1 | 1 |
| 4# | 1 | 0 | 0 | 4# | 1 | 0 | 0 | 5# | 1 | 0 | 1 |
| 5# | 1 | 0 | 1 | 6# | 1 | 1 | 0 | 5# | 1 | 0 | 1 |
| 6# | 1 | 1 | 0 | 6# | 1 | 1 | 0 | 7# | 1 | 1 | 1 |
| 7# | 1 | 1 | 1 | 0# | 0 | 0 | 0 | 7# | 1 | 1 | 1 |

SEMICONDUCTOR MEMORY DEVICE PERFORMING HIGH SPEED COINCIDENCE COMPARISON OPERATION WITH DEFECTIVE MEMORY CELL ADDRESS

BACKGROUND OF THE INVENTION

1. Field of the Invention

The present invention relates to a semiconductor memory device, and more particularly to a circuit configuration of a redundancy determination circuit for replacing a defective memory cell with a redundant memory cell.

2. Description of the Background Art

A dynamic random access memory (hereinafter referred to as DRAM) used as a main memory, though having been progressed in its high speed operation, still cannot follow an operating speed of a microprocessor (MPU). Therefore, a fear exists that an access time and a cycle time of a DRAM act as bottle necks against performance of the system as a whole to reduce it. In recent years, a proposal has been made, in light of such a situation, of a double data rate SDRAM (hereinafter referred to as DDR-SDRAM) operating in synchronization with a complementary clock signal as a main memory for a high speed MPU.

In DDR-SDRAM, for the purpose of a high speed access, specifications are common that get a high speed access to consecutive bits in synchronization with a rise and fall of a clock signal.

A double data rate scheme commonly employs a configuration in which a memory array is divided into two memory blocks: a memory block having even-numbered bit lines corresponding to even-numbered addresses and a memory block having odd-numbered bit lines corresponding to odd-numbered addresses, wherein an even-numbered bit line and an odd-numbered bit line are selected in parallel to each other to get simultaneous accesses, thereby facilitating a data output operation at a double clock frequency. In such a configuration, there has generally been used a method in which an address inputted externally is converted to even-numbered and odd-numbered addresses.

FIG. 7 is a schematic block diagram showing an overall configuration of a conventional synchronous semiconductor memory device 10.

Referring to FIG. 7, a synchronous semiconductor memory device 10 includes: a memory block 6a corresponding to even-numbered addresses and a memory block 6b corresponding to odd-numbered addresses, which are obtained by dividing a memory array into the two blocks. Memory blocks 6a and 6b each have memory cells arranged in a matrix and redundant memory cells for saving a defective memory cell. Here, typically shown in memory block 6a are one word line WL provided correspondingly to a row, one even-numbered bit line BLE provided correspondingly to a column and one redundant bit line BLSE provided corresponding to a redundant memory cell column constituted of redundant memory cells. In addition, typically shown in memory block 6b are one word line WL provided correspondingly to a row, one odd-numbered bit line BLO provided correspondingly to a column and one redundant bit line BLSO provided corresponding to a redundant memory cell column constituted of redundant memory cells. Hereinafter, the redundant bit lines are simply referred to as redundant bit line BLS in a collective manner.

Note that in the following examples, memory blocks 6a and 6b each have 256 bit lines and a plurality of bit lines, which is one example. Furthermore, in memory block 6a, even-numbered addresses are sequentially allocated to even-numbered bit lines. For example, addresses 0#, 2#, 4#, . . . and so on are sequentially allocated. Furthermore, in memory block 6b, odd-numbered addresses are sequentially allocated to odd-numbered bit lines. For example, addresses 1#, 3#,5#, . . . and so on are sequentially allocated.

Synchronous semiconductor memory device 10 further includes: a control signal generating circuit 20 generating control signals for internal circuits and control signal generating circuit 20 especially generates an internal clock signal CLK (hereinafter also simply referred to as clock signal CLK) used in timing control of internal circuits in synchronization with an external clock signal Ext.CLK.

Synchronous semiconductor memory device 10 further includes: a now decoder 2 performing row selection in memory blocks 6a and 6b; column decoders 3a and 3b receiving, as respective inputs, even-numbered and odd-numbered addresses to perform column selection; spare column decoders 4a and 4b performing column selection for redundant bit lines BLS in respective memory blocks according to a defect determination signal; a multiplexer 5a outputting read data read out from memory block 6a to an amplifier 7a on the basis of a column select operation by one of column decoder 3a and spare column decoder 4a; and a multiplexer 5b outputting read data read out from memory block 6b to an amplifier 7b on the basis of a column select operation by one of column decoder 3b and a spare column decoder 4b.

Synchronous semiconductor memory device 10 further includes: amplifiers 7a and 7b amplifying read data outputted from multiplexers 5a and 5b; a parallel-serial conversion circuit 8 sequentially arranging two read data amplified by amplifiers 7a and 7b so as to output the two data in synchronization with a rise and fall, respectively, of clock signal CLK; and an output buffer 9 outputting read data arranged by parallel-serial conversion circuit 8 to an external terminal DQ.

Synchronous semiconductor memory device 10 further includes: a redundancy determination circuit 35a for determining redundancy of memory block 6a corresponding to an even-numbered address; and a redundancy determination circuit 35b for determining redundancy of memory block 6b corresponding to an odd-numbered address. Redundancy determination circuits 35a and 35b include respectively: program circuits 33a and 33b (hereinafter also referred to as program circuit 33 in a collective manner) setting column addresses of defective memory cells (hereinafter also referred to as defect address); and comparison circuits 32a and 32b (hereinafter also referred to as comparison circuit 32 in a collective manner) comparing a defective address and an inputted address with each other to generate defect determination signals SCEE and SCEO on the basis of results of the comparisons.

Synchronous semiconductor memory device 10 further includes: an address buffer 30 buffering a column address CA inputted from an external address terminal PINA to output addresses to column decoders 3a and 3b. Address buffer 30 has a burst counter 31. Burst counter 31 counts up a bit or bits of part of a column address on the basis of a preset burst length in synchronization with clock signal CLK. Address buffer 30, on burst reading, latches residual bits obtained after excluding the bit or bits of part of the column address and outputs the residual bits together with the bit or bits of part which have been counted up. Herein, the burst length indicates a length of data outputted consecutively.

Synchronous semiconductor memory device 10 includes an even-numbered address buffer 40, provided between address buffer 30 and column decoder 3a, and generating an even-numbered address CAE for performing a column select operation in memory block 6a and even-numbered address buffer 40 receives, as an input, a column address CA including the bit or bits of part, which have been counted up by a burst counter 31 of address buffer 30. Synchronous semiconductor memory device 10 further includes: an odd-numbered address buffer 50, provided between address buffer 30 and column decoder 3b, and generating an odd-numbered address CAO for performing a column select operation in memory block 6b and odd-numbered address buffer 50 receives, as an input, a column address CA including the bit or bits of the part, which have been counted up by burst counter 31 of address buffer 30.

Address buffer 30 receives column address CA <8:0> from external address terminal PINA. Note that column address CA <8:0> is indicated column addresses CA<0> to CA<8>. Similarly, a symbol <x:0> is hereinafter used in collective expression of a sequence of <0> to <x>. Alternatively, column addresses CA<0> to CA<x> are also collectively referred to as column address CA.

Description, here, will be given of burst reading of synchronous semiconductor memory device 10.

Column decoders 3a and 3b select groups of bit lines on which burst reading is performed in respective memory blocks 6a and 6b according to column address CA of an upper bit or bits defined according to a burst length. For example, when a burst length is 2, one even-numbered line and one odd-numbered bit line are selected. When a burst length is 4, two even-numbered bit lines and two odd-numbered bit lines are selected.

Similarly, when a burst length is 8, four even-numbered bit lines and four odd-numbered bit lines are selected.

For thus selected bit line or lines corresponding to a burst length, designation is performed of an address in the leading place (hereinafter also referred to as a start address) at which data is firstly read out according to column address of a lower bit or bits, followed by designations of an address in the next place in ascending order. That is, when a start address is an even-numbered address, an odd-numbered address in the next place is designated in ascending order, thus selecting both addresses in parallel to each other.

Then, column address CA of a lower bit or bits is counted up by burst counter 31 according to a burst length, followed by designation of the next start address. With repetitions of the operation, burst reading corresponding to a burst length is performed. Burst reading is disclosed in technical literatures such as Samsung electronics DDR SDRAM Specification Version 0.6, REV. 0.6 Mar. 21, 2001.

FIG. 8 is a timing chart in a case of a burst length 4. Here is shown a case where addresses 0# to 3# are selected according to upper bits of column address CA.

For example, a start address is designated on the basis of column address CA inputted from an external address terminal together with a read instruction at time point t1.

When a start address is 0#, bit lines with addresses 0# and 1# are both selected, followed by selection of bit lines with addresses 2# and 3# in the next run.

Parallel selection is performed of even-numbered and odd-numbered bit lines corresponding to start address 0# and address 1# according to column address CA from outside in synchronization with a rise of clock signal at time point t1. In response to this, read data is outputted to parallel-serial conversion circuit 8. The next start address is designated as address 2# by counting-up of burst counter 31 in synchronization with a fall of clock signal at time point t2 and address 3# is also designated in ascending order. Parallel selection is performed of even-numbered and odd-numbered bit lines corresponding to start address 2# and address 3# in synchronization with a rise of clock signal at time point t3. In response to this, read data is outputted to parallel-serial conversion circuit 8.

Parallel-serial conversion circuit 8 arranges and outputs read data in response to a rise and fall of clock signal starting at time point t4, and read data on bit lines corresponding to addresses 0#, 1#, 2# and 3# in ascending order starting with a start address 0# in the first time of the runs are sequentially outputted from output buffer 9.

Similarly, in a case where a start address is 1#, bit lines with addresses 1# and 2# are both selected, followed by selection of both of bit lines with addresses 3# and 0#. In company with this, read data on bit lines corresponding to addresses 1#, 2#, 3# and 0# in ascending order starting with start address 1# in the first time of the runs are sequentially outputted from output buffer 9.

Similarly, in a case where a start address is 2#, bit lines with addresses 2# and 3# are both selected, followed by selection of both of bit lines with addresses 0# and 1#. In company with this, read data on bit lines corresponding to addresses 2#, 3#, 0# and 1# in ascending order starting with start address 2# in the first time of the runs are sequentially outputted from output buffer 9.

Similarly, in a case where a start address is 3#, bit lines with addresses 3# and 0# are both selected, followed by selection of both of bit lines with addresses 1# and 2#. In company with this, read data on bit lines corresponding to addresses 3#, 0#, 1# and 2# in ascending order starting with start address 3# in the first time of the runs are sequentially outputted from output buffer 9.

FIG. 9 is a table showing a relationship of a start address designated according to an input of column address CA of a lower bit, and even-numbered address CAE <0> and odd-numbered address CAO <0> given to respective column decoders 3a and 3b when the start address is designated in such a way. The table shown in FIG. 9 is corresponding to a case of burst length 2. Here, addresses 0# and 1# are selected according to column address CA of an upper bit. Furthermore, when column address CA <0> of a lower bit is 0, address 0# is selected, and when column address is 1, address 1# is selected. As one example, when column address CA <0> is 0, start address is designated as 0#. The next address 1# is designated similarly in ascending order. Therefore, when start address 0# is designated, even-number address CAE <0> of a lower bit given to column decoder 3a is 0. Furthermore, odd-numbered address CAO <0> of a lower bit given to column decoder 3a is 1.

In company with this, data is read out from bit lines corresponding to addresses 0# and 1# in parallel to each other. The order for outputting data is such that read data is outputted from output buffer circuit 9 in the order of addresses 0# and 1#.

FIG. 10 is a table showing a relationship of a start address designated according to an input of column address CA <1:0> of lower bits, and even-numbered address CAE <1:0> and odd-numbered address CAO <1:0> given to respective column decoders 3a and 3b when the start address is designated in such a way. The table shown in FIG. 10 is corresponding to a case of burst length 4. Here, addresses 0# to 3# are selected according to column address CA of upper bits.

Furthermore, addresses 0# to 3# are selected correspondingly to values of column address CA <1:0>. To be concrete, start address 0# is designated in correspondence to "00" from an upper bit side of column address CA <1:0>. Start address 1# is designated in correspondence to "01" from the upper bit side of column address CA <1:0>. Start address 2# is designated in correspondence to "10" from the upper bit side of column address CA <1:0>. Start address 3# is designated in correspondence to "11" from the upper bit side of column address CA <1:0>.

As one example, when "00" is inputted from the upper bit side of column address CA <1:0>, a start address in the leading place is designated as 0#. With such designation, even-number address CAE <1:0> given to column decoder 3a assumes "00" from the upper bit side in correspondence to address 0#. Odd-numbered address CAO <1:0> given to column decoder 3b assumes "01" from the upper bit side in correspondence to address 1#. In company with this, parallel selection is performed of an even-numbered bit line and an odd-numbered bit line corresponding to respective addresses 0# and 1#. Read data is arranged in and outputted from parallel-serial conversion circuit 8 in the order of bit lines corresponding to respective addresses 0# and 1#. Then, burst counter 31 counts up column address of the lower bits in synchronization with clock signal CLK to increment a value of column address CA <1:0> by 2. Here, a value "00" from the upper bit side of column address CA <1:0> is counted up to "10". That is, start address 0# is changed to 2#. Then, even-numbered address CAE <1:0> corresponding to address 2# given to column decoder 3a assumes "10" from the upper bit side. Furthermore, odd-numbered address CAO <1:0> corresponding to address 3# given to column decoder 3b assumes "11" from the upper bit side. In company with this, parallel selection is performed of bit lines corresponding to addresses 2# and 3#. Read data is arranged in and outputted from parallel-serial conversion circuit 8 in the order of bit lines corresponding to respective addresses 2# and 3#. Burst counter 31, in a case of a burst length 4, counts up values of the lower 2 bits on counting-up without a carry-over.

FIG. 11 is a table showing a relationship of a start address designated according to an input of column address CA <2:0> of lower bits, and even-numbered address CAE <2:0> and odd-numbered address CAO <2:0> given to respective column decoders 3a and 3b when the start address is designated in such a way. The table shown in FIG. 11 is corresponding to a case of burst length 8. Here, addresses 0# to 7# are selected according to column address CA of the upper bits.

Furthermore, addresses 0# to 7# are selected in correspondence to respective values of column addresses CA <2:0>. To be concrete, start address 0# is designated in correspondence to "000" from the upper bit side of column address CA <2:0>. Start address 1# is designated in correspondence to "001" from the upper bit side of column address CA <2:0>. Start address 2# is designated in correspondence to "010" from the upper bit side of column address CA <2:0>. Start address 3# is designated in correspondence to "011" from the upper bit side of column address CA <2:0>. Start address 4# is designated in correspondence to "100" from the upper bit side of column address CA <2:0>. Start address 5# is designated in correspondence to "101" from the upper bit side of column address CA <2:0>. Start address 6# is designated in correspondence to "110" from the upper bit side of column address CA <2:0>. Start address 7# is designated in correspondence to "111" from the upper bit side of column address CA <2:0>.

When "000" is inputted from the upper bit side of column address CA <2:0>, a start address in the leading place is set to 0#. In response to this, "000" corresponding to address 0# and "001" corresponding to address 1# are therefore given to respective column decoders 3a and 3b.

Burst counter 31 then counts up to add 2 to a value of column address CA <2:0> in synchronism with clock signal CLK. A value of "000" from the upper bit side of column address CA <2:0> is counted up to "010". That is, start address 0# in the leading place is changed to 2#. In response to this, "010" corresponding to address 2# and "011" corresponding to address 3# are therefore given to respective column decoders 3a and 3b.

Burst counter 31 then counts up in synchronism with clock signal CLK to increase column address CA <2:0> to "110" from the upper bit side. That is, start address 2# in the leading place is changed to 4#. In response to this, "100" corresponding to address 4# and "101" corresponding to address 5# are therefore given to respective column decoders 3a and 3b.

Burst counter 31 then counts up in synchronism with clock signal CLK to increase column address CA <2:0> to "110" from the upper bit side. That is, start address 4# in the leading place is changed to 6#. In response to this, "110" corresponding to address 6# and "111" corresponding to address 7# are therefore given to respective column decoders 3a and 3b.

In company with this, data of a burst length 8 from bit lines corresponding to start addresses 0#, 1#, . . . 7# is sequentially arranged in and outputted from parallel-serial conversion circuit 8. Note that, burst counter 31, in a case of a burst length 8, counts up lower three bits on counting-up without a carry-over.

Considered here is about even-numbered address CAE and odd-numbered address CAO inputted to column decoders 3a and 3b on the basis of an input of column address CA.

Column address CA <0> corresponds to an address indicating one of even-numbered and odd-numbered addresses. When column address CA <0> is 0, it is an even-numbered address, while when column address CA <0> is 1, it corresponds to an odd-numbered address. Therefore, even-numbered address CAE <0> and odd-numbered address CAO <0> are only to simply express, for the sake of convenience, that those are even-numbered address and an odd numbered address; an even-numbered address CAE <0> is fixed to 0 as a value and an odd-numbered address CAO <0> is fixed to 1 as a value.

Therefore, effective even-numbered address CAE <8:1> other than even-numbered address CAE <0> is inputted to column decoder 3a. Furthermore, effective odd-numbered address CAO <8:1> other than even-numbered address CAO <0> is inputted to column decoder 3b.

Then, in a case of a burst length 4 of FIG. 10, for example, if a start address even-numbered in counting starting with the leading place is 0# as selected according to an input of "00" from the upper bit side of column address CA <1:0>, a necessity arises for selecting the next address 1# in ascending order. That is, it is required to give "00" and "01" to respective column addresses 3a and 3b from the upper bit side. Then, inputted column address CA <1:0> as is can be used for even-numbered address CAE without conversion in any way. Odd-numbered address CAO can be used as is since, though odd-numbered address CAO assumes a value obtained by adding 1 to column address CA <1:0>, odd-numbered address CAO <0> is fixed to 1; therefore no necessity arises for converting column address CA <1:0>.

However, for example, in a case where start address 1# odd-numbered starting with the leading place in correspondence to inputting of "01" from the upper bit side of column address CA <1:0>, a necessity arises for giving "10" and "01" from the upper bit side to respective column decoders 3a and 3b since it is required that the next address 2# is selected in ascending order. In this case, inputted column address CA <1:0> can be used as odd-numbered address CAO as is. Even numbered address CAE assumes a value obtained by adding 1 to inputted column address CA <1:0>, thereby requiring a carry-over. In this case, it is required that column address CA <1> is converted to generate effective even-numbered address CAE <1>.

That is, in a case where a start address in an even-numbered place of the order is selected in correspondence to column address CA <1:0>, an odd-numbered address selecting an address in an odd numbered place is not necessary to be converted since the lowest bits CAE <0> and CAO <0> of an even-numbered address and an odd-numbered address, respectively, are fixed, though a value of CA <0>, which is the lowest bit of column address CA, assumes 1. On the other hand, in a case where a start address in an odd-numbered place of the order is selected in correspondence to column address CA <1:0>, an even-numbered address selecting an address in an even numbered place requires conversion of column address CA <1> to even-numbered address CAE <1> used for a column select operation since even-numbered address CAE assumes a value with a carryover due to adding 1 to column address CA <1:0>.

In a case of a burst length 8 of FIG. 11 as well, similar to the case of a burst length 4 of FIG. 10, if a start address is selected in correspondence to column address CA <2:0> of lower bits, a necessity arise for a conversion operation when a carry-over occurs in selection of the next address.

To be concrete, in a case where, similar to the case of a burst length 4, a start address in an odd-numbered place is selected in correspondence to column address CA <2:0>, an odd-numbered address selecting an address in an even-numbered place requires conversion of column address CA <1> to even-numbered CAE <1> since a carry-over occurs due to adding 1 to column address CA <2:0>.

For example, in a case where column address CA <2:0> is inputted from the upper bit side with "011" to select a start address 3# odd-numbered in counting starting with the leading place, "100" and "011" are necessary to be given from the upper bit side to respective column decoders 3a and 3b since it is required that the next start address 4# is selected in ascending order. In this case, inputted column address CA <2:0> has only to be used as is as odd-numbered address CAO. However, even-number address. CAE requires conversion of column address CA <2> to effective even-address CAE <2> since a carry-over is required by adding 1 to inputted column address CA <2:0>. For example, in a case where column address CA <2:0> is inputted with "111" from the upper bit side to select start address 7# odd-numbered in counting staring with the leading place as well, effective even-number CAE <2> has to be obtained from conversion of column address CA <2>.

Therefore, while odd-numbered address CAO can be used as is without conversion of column address CA, even-numbered address CAE requires conversion of column address CA in a prescribed condition.

FIGS. 12 and 13 are diagrams of configuration of decoders DC1 and DC2 converting even-numbered address CAE <1> and even-numbered address CAE <2> included in even-number address buffer 40 in a prescribed condition.

Referring to FIG. 12, decoder DC1 includes NOR circuits 41 to 43; a NAND circuit 44; an OR circuit; and inverters 46 to 48.

NOR circuit 41 outputs a result of a NOR logical operation according to inputs of burst control signals MBL4 and MBL8 through inverter 46 to NAND circuit 44. NAND circuit 44 transmits a result of a NAND logical operation according to an output signal from inverter 46 and, as an input, column address CA <0> to a node NO. NOR circuit 43 receives column address CA <1> and an input, which is an output signal of NAND circuit 44 transmitted to node NO to output a result of a NOR logical operation to OR circuit 45. NOR circuit 42 receives, as inputs, an inverted signal of a signal transmitted to node NO through inverter 47 and an inverted signal of column address CA <1> through inverter 48 to output a result of a NOR logical operation to OR circuit 45. OR circuit 45 receives inputs from NOR circuits 42 ad 43 to output a result of an OR operation as even-address CAE <1>. Note that burst control signals MBL2 and MBL4 are inputted on the basis of a set burst length. Here, burst control signal MBL4 is a signal indicating that a burst length is 4. Burst control signal MBL8 is a signal indicating that a burst length is 8.

Decoder DC1 converts column address CA <1> to generate even-numbered address CAE <1> if column address CA is in a prescribed condition in a case of a burst length 4 or 8. The prescribed condition is a case where, when inputted column address CA is added with 1, a carry-over of column address CA <0> is required, that is a case where column address CA <0> is 1.

To be concrete, when column address CA <1:0> is "01" or "11" from the upper bit side, the next column address CA is accompanied with a carry-over. In the cases, even-numbered address CAE <1> is converted to inverted data of column address CA <1>.

FIG. 13 shows decoder DC2 outputting even-numbered address CAE <2>.

Referring to FIG. 13, decoder DC2 includes: a NAND circuit 49 receiving inputs of burst control signal MBL8 and column address CA <1:0> to transmit a result of a NAND logical operation to a node N1; a NOR circuit 53 outputting a result of a NOR logical operation on column address CA <2> and a signal transmitted to node N1 to OR circuit 54; a NOR circuit 52 receiving, as inputs, an inverted signal of a signal transmitted to node N1 through inverter 50 and an inverted signal of column address CA <2> through inverter 51 to output a result of a NOR logical operation result; and an OR circuit 54 receiving inputs from NOR circuits 52 and 53 to output a result of an OR logical operation as even-numbered address CAE <2>.

Decoder DC2 converts column address CA <2> to generate even-numbered address CAE <2> if column address CA is in a prescribed condition in a case of a burst length 8. The prescribed condition is a case where, when inputted column address CA is added with 1, a carry-over of column address CA <1> is required, that is a case where column address CA <1:0> is "11" from the upper bit side.

To be concrete, when column address CA <2:0> is "011" or "111" from the upper bit side, the next column address CA is accompanied with a carry-over. In the cases, even-numbered address CAE <2> is converted to inverted data of column address CA <2>.

Column address CA is converted using decoders DC1 and DC2 in the prescribed condition to thereby, be able to select a desired address. Accordingly, parallel selection can be performed of two bit lines corresponding to an even-numbered address and an odd numbered address; therefore a high speed double data rate scheme can be realized.

On the other hand, in a case where a defective memory cell is included in memory cells, redundant memory cells are provided in order to save such a defective memory cell and, when a column address selecting a defective memory cell is inputted, a redundant bit line corresponding to a redundant memory cell is selected instead of a bit line corresponding to a defective cell. A redundancy determining circuits 35a and 35b performs a redundancy determination on whether or not a defective memory cell has been selected.

FIG. 14 is a circuit diagram of a program unit PU setting a defect. address of one bit included in a program circuit in each of redundancy determining circuits 35a and 35b.

Program unit PU includes a P-channel MOS transistor 82; an N-channel MOS transistor 83; inverters 80 and 81; and a fuse element 84. P-channel MOS transistor 82 is connected between power supply voltage VCC and node N10 and receives a control signal φ1 to turn itself on/off. N-channel MOS transistor 83 is connected between node N10 and fuse element 84 and receives, as an input, a control signal φ2 to turn itself on/off. Fuse element 84 is placed between N-channel MOS transistor 83 and substrate voltage VSS and can be blown by irradiation with laser light from outside in a non-volatile manner. Inverter 80 inverts a signal transmitted to node N10 to transmit the inverted signal to a node 11 and inverter 81 inverts a signal transmitted to node N11 to transmit the inverted signal to node N1. A latch is constituted of inverters 80 and 81. A signal transmitted to node N11 is outputted to a comparison circuit 32 as a defect address FCA of one bit. For example, if control signal φ1 is at L level for a prescribed period, defect address FCA of one bit is reset to 0. If control signal φ2 is at H level for a prescribed period, defect address FCA of one bit is 1 in a case where fuse element 84 is not blown. On the other hand, if fuse element 84 has been blown, defect address FCA of one bit stays at 0 as is. Therefore, by blowing fuse element 84, defect address FCA of one bit can be set to 0 through programming.

Therefore, a plurality of program units PU are arranged in parallel to each other and programming is performed in each of plurality of program units PU, thereby enabling setting of defect address FCA corresponding to a column address of a defective memory cell.

FIG. 15 is a circuit configuration diagram of comparison circuit 32a.

Comparison circuits 32a and 33b are of the same circuit configuration as each other and description here will be given of comparison circuit 32a.

Comparison circuit 32a includes: exclusive NOR circuits 60 to 67; NAND circuits 68 to 71 and 74; NOR circuits 72 and 73; and an inverter 75. Exclusive NOR circuit 60 receives, as inputs, even-numbered address CAE <1> and defect address FCA <1> to output a result of an exclusive NOR logical operation. The other exclusive NOR circuits 61 to 67, in a similar manner, receive even-numbered addresses CAE <2> to CAE <8> and defect addresses FCA <2> to FCA <8> of bits corresponding to respective even-numbered address CAE <2> to CAE <8> to output results of exclusive NOR logical operations. NAND circuit 68 receives inputs from exclusive NOR circuits 60 and 61 to output a result of a NAND logical operation to NOR circuit 72. NAND circuit 69 receives inputs from exclusive NOR circuits 62 and 63 to output a result of a NAND logical operation to NOR circuit 72. NAND circuit 70 receives inputs from exclusive NOR circuits 64 and 65 to output a result of a NAND logical operation to NOR circuit 73. NAND circuit 71 receives inputs from exclusive NOR circuits 66 and 67 to output a result of a NAND logical operation to NOR circuit 73. NAND circuit 72 receives inputs from NAND circuits 68 and 69 to output a result of a NOR logical operation to NAND circuit 74. NAND circuit 73 receives, as inputs, outputs of NAND circuits 70 and 71 to output a result of a NOR logical operation to NAND circuit 74. NAND circuit 74 receives inputs from NOR circuits 72 and 73 to output a result of a NAND logical operation to inverter 75. Inverter 75 outputs an inverted signal of an output signal of NAND circuit 74 as defect determination signal SCE.

Comparison circuit 32a compares even-numbered address CAE <8:1> and defect address FCA <8:1> from program circuit 33a to generate defect determination signal SCE. To be concrete, when each bit of even-numbered address CAE <8:1> and each bit of defect address FCA <8:1> all coincide with each other, defect determination signal SCE is set to H level. In response to the setting, spare column decoder 4a is activated and data is read out from a redundant bit line corresponding to a redundant memory cell column.

Consideration is given to a determination operation of redundancy determining circuits 35a and 35b of an even-numbered bit line and an odd-numbered bit line, respectively, and in a case of odd-numbered address CAO corresponding to an odd bit line, a bit address of column address CA is used as is in redundancy determining circuit 35a, while in a case of even-numbered address CAE, even-numbered address CAE is a conversion of column address CA on the basis of even-numbered address buffer 40 in a prescribed condition; therefore, a determination operation of redundancy determining circuit 35b of even-numbered address CAE lags by a conversion time of even-numbered address buffer 40. In company with the delay, a column select operation also delays; therefore, a problem arises of no possibility of a high speed operation in a double data rate scheme in which data reading is performed in synchronization with clock signal.

SUMMARY OF THE INVENTION

It is an object of the present invention to provide a synchronous semiconductor memory device canceling a delay in a determination operation accompanying a conversion operation of an even-numbered address buffer to perform high speed data reading and so on.

A semiconductor memory device according to an aspect of the present invention includes: plural memory cells arranged in a matrix; redundant memory cells for being substituted for a defective memory cell among the plural memory cells for the sake of saving; an address conversion circuit; a defect address conversion circuit; an address comparison circuit; and a select circuit. The address conversion circuit receives an address signal of L bits (where L is an integer of 2 or more) for selecting plural memory cells to apply a prescribed conversion operation to a bit or bits of part of the L bits when necessary. The defect address conversion circuit receives a defect address signal of L bits, stored in advance, and corresponding to the defective memory cell to apply an inverse conversion operation, exercised by inverting a relationship between an input and output in the prescribed conversion operation applied by the address conversion circuit, to a bit or bits of part of the defect address signal. The address comparison circuit receives an address signal before passage through the address conversion circuit and a defect address signal after passage through the defect address conversion circuit to compare them with each other. The select circuit gets access to one of a memory cell corresponding to an address signal after passage through the address conversion circuit and a redundant memory cell according to a result of comparison in the address comparison circuit.

A main advantage of the present invention is that an address signal before passage through the address conversion circuit and a defect address signal after passage through the defect address conversion circuit are compared with each other in the address comparison circuit, thereby enabling access to a redundant memory cell according to a result of the comparison. That is, since no necessity arises for use of an address signal after passage through the address conversion circuit in the address comparison circuit, suppression can be achieved of a delay time accompanying passage through the address conversion circuit in the address conversion circuit. Accordingly, high speed access to a memory cell and a redundant memory cell can be obtained, thereby enabling times required for data reading and writing to be shortened.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a table showing a relationship of a start address designated according to an input of column address CA of a lower bit vs. even-numbered address CAE <0> and odd-numbered address CAO <0> in a case of a burst length 2;

FIG. 10 is a table showing a relationship of a start address designated according to an input of column address CA <1:0> of lower bits vs. even-numbered address CAE <1:0> and odd-numbered address CAO <1:0> in a case of a burst length 4;

FIG. 11 is a table showing a relationship of a start address designated according to an input of column address CA <2:0> of lower bits vs. even-numbered address CAE <2:0> and odd-numbered address CAO <2:0> in a case of a burst length 8;

FIG. 15 is a circuit configuration diagram of a comparison circuit 32a.

DESCRIPTION OF THE PREFERRED EMBODIMENTS

Detailed description will be given of embodiments of the present invention with reference to the accompanying drawings. Note that the same symbols are attached to the same constituents or corresponding constituents in the several views of the drawings and any of descriptions thereof will not be repeated.

FIRST EMBODIMENT

Figure 1:
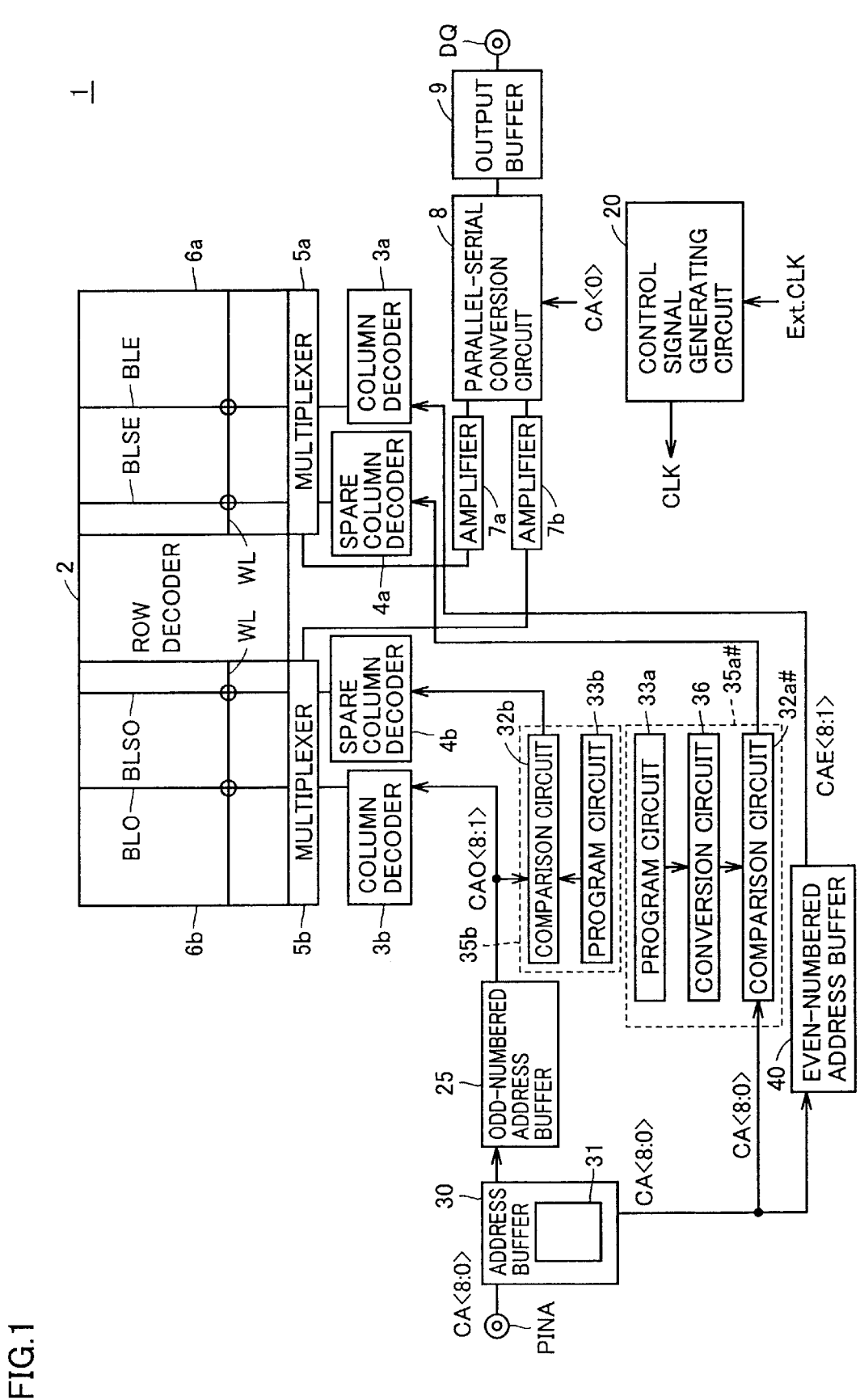
FIG. 1 is a diagram of an overall configuration of a synchronous semiconductor memory device of the present invention.

Referring to FIG. 1, a synchronous semiconductor memory device 1 according to the first embodiment includes: a row decoder 2; column decoders 3a and 3b; spare column decoders 4a and 4b; multiplexers 5a and 5b; memory blocks 6a and 6b; amplifiers 7a and 7b; a parallel-serial conversion circuit 8; an output buffer 9; a control signal generating circuit 20; an address buffer 30; redundancy determining circuits 35a# and 35b; an even-numbered address buffer 40; and an odd-numbered address buffer 25.

Figure 7:
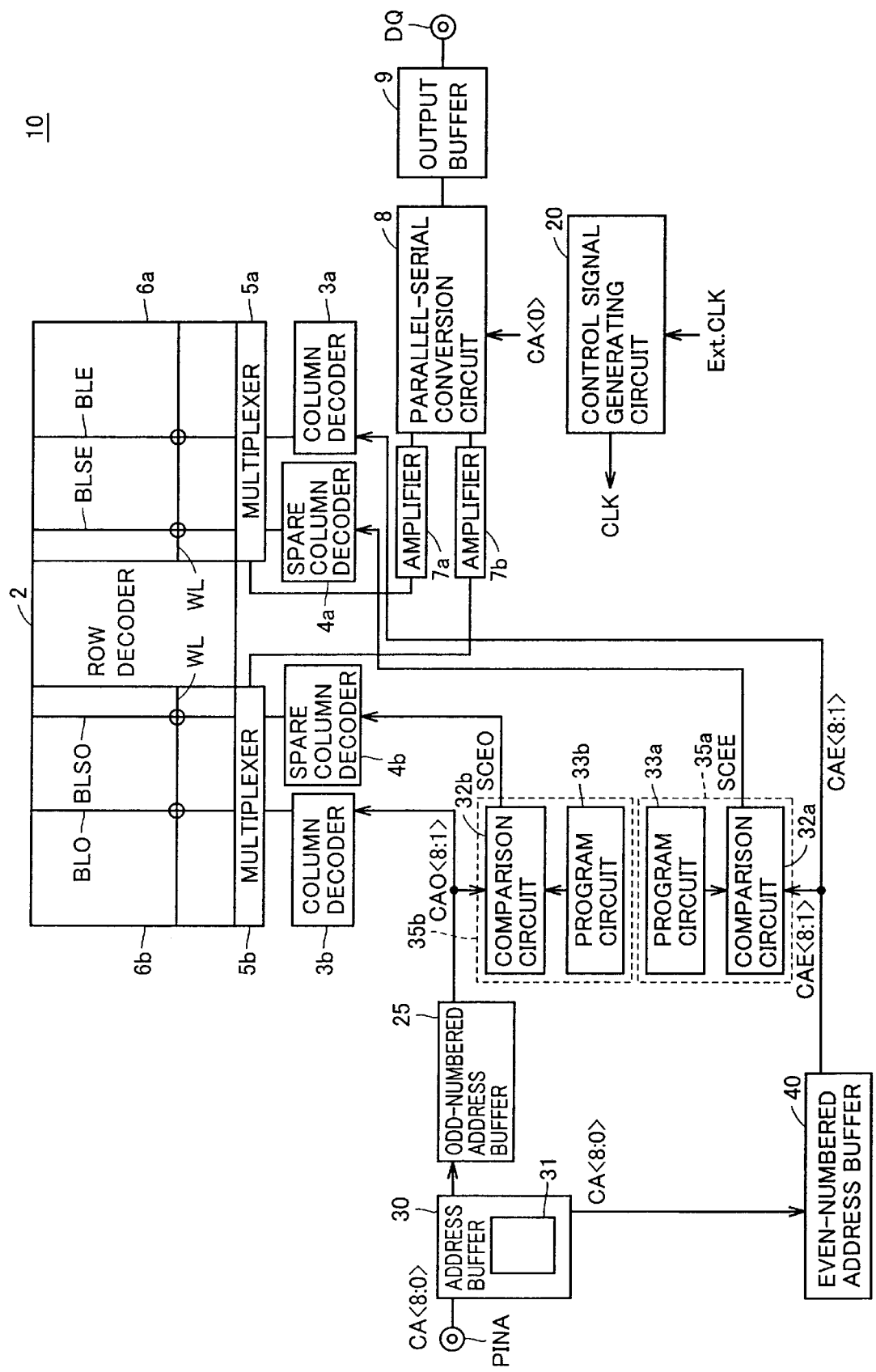
FIG. 7 is a schematic block diagram showing an overall configuration of a conventional synchronous semiconductor memory device 10.
Figure 8:
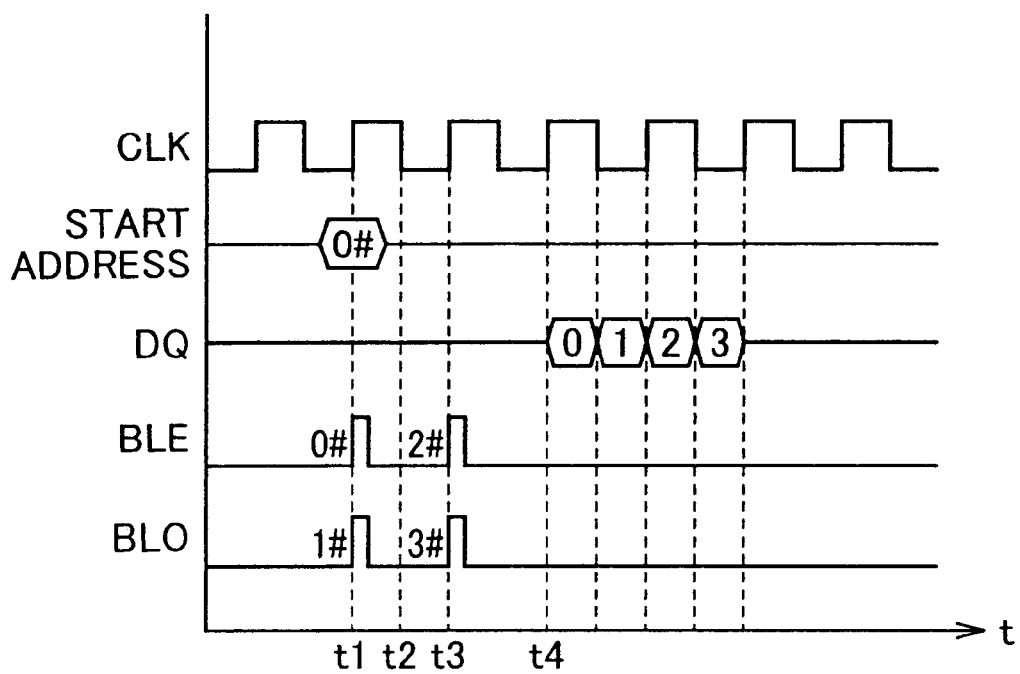
FIG. 8 is a timing chart in which data is outputted in synchronization with a clock signal CLK in a case of a burst length 4.
Figure 12:
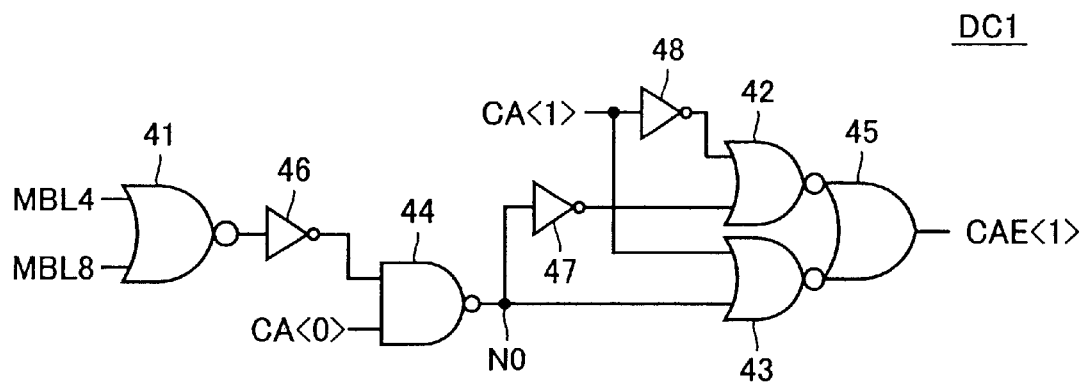
FIG. 12 is a diagram of configuration of a decoder DC1 outputting even-numbered address CAE <1> included in an even-number address buffer 40.
Figure 13:
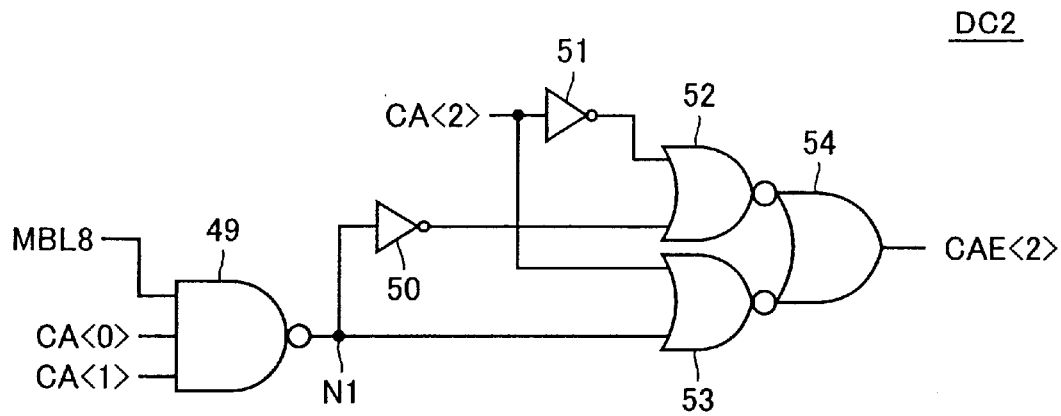
FIG. 13 is a diagram of configuration of a decoder DC2 outputting even-numbered address CAE <2> included in an even-number address buffer 40.
Figure 14:
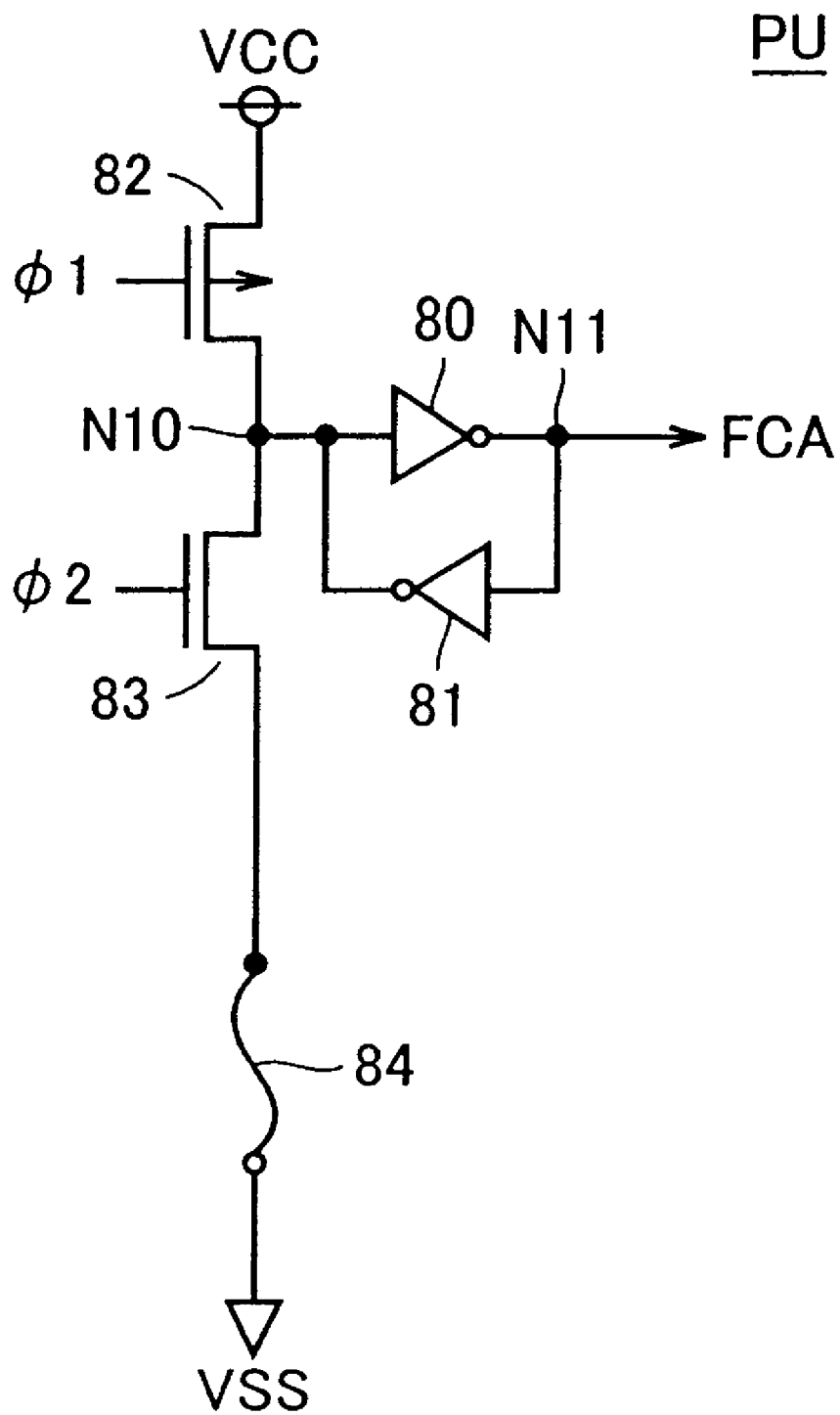
FIG. 14 is a circuit diagram of a program unit PU setting a defect address of one bit included in a program circuit.
Figure 15:
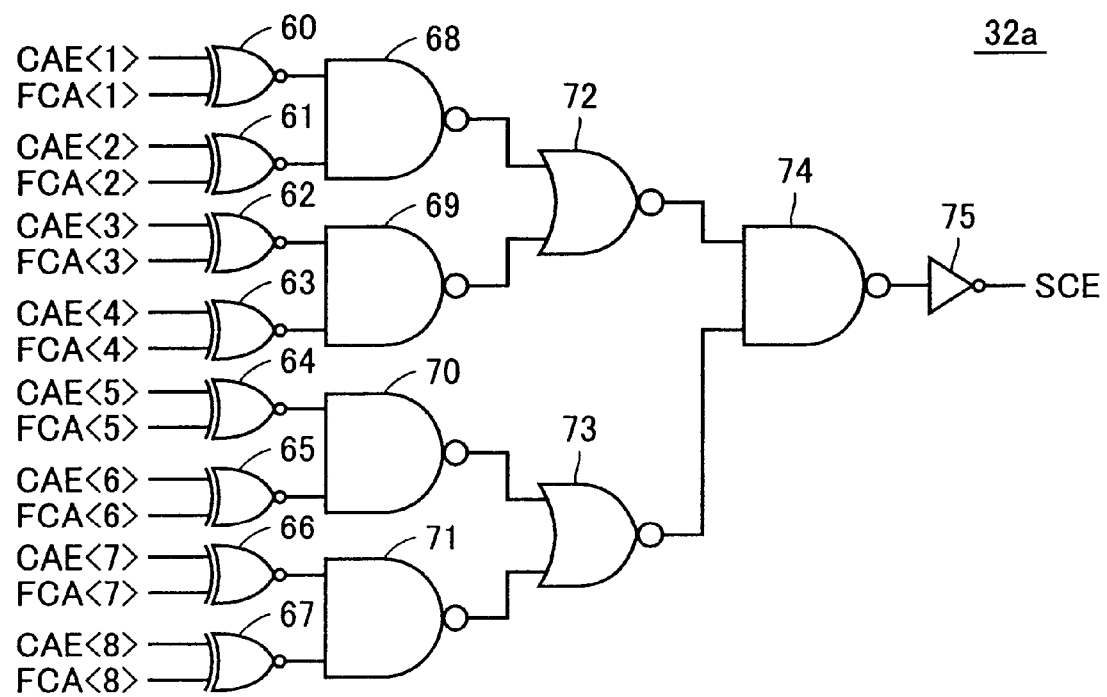

Synchronous semiconductor memory device 1 is different in comparison with synchronous semiconductor memory device 10 of FIG. 7 in aspects that redundancy determining circuit 35a is replaced with redundancy determining circuit 35a# and column address CA is inputted directly to redundancy determining circuit 35a#. The other aspects are similar, so any of detailed descriptions thereof will not be repeated.

Redundancy determining circuit 35a# is different in comparison with redundancy determining circuit 35a in aspects that comparison circuit 32a is replaced with comparison circuit 32a# and furthermore, conversion circuit 36 is provided in which a defect address of program circuit 33a is converted and outputted to comparison circuit 32a#.

It is an object in the first embodiment of the present invention to realize a high speed redundancy determination operation by converting a defect address set in program circuit 33a using conversion circuit 36 to compare the converted defect address directly with column address CA in a prescribed condition.

Figure 2:
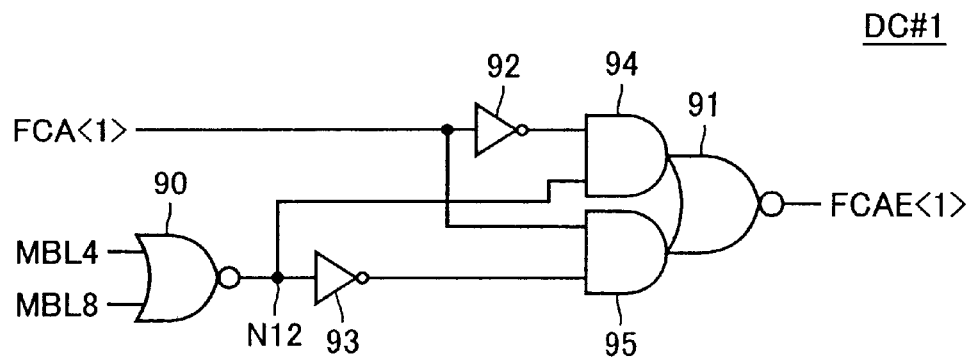
FIG. 2 is a circuit configuration diagram of a decoder converting a defect address to a defect conversion address in a conversion circuit.

Referring to FIG. 2, decoder DC1# according to the first embodiment includes: a NOR circuit 90 receiving, as inputs, burst control signals MBL4 and MBL8 to transmit a result of a NOR logical operation to a node N12; an AND circuit 95 receiving, as inputs, an inverted signal of a signal transmitted to node N12 through an inverter 93 and defect address FCA <1> to output a result of an AND logical operation; an AND circuit 94 receiving, as inputs, an inverted signal of defect address FCA <1> through a inverter 92 and an output signal of NOR circuit 90 to output a result of an AND logical operation; and a NOR circuit 91 receiving inputs from AND circuits 94 and 95 to output a result of a NOR logical operation as defect conversion address FCAE <1>.

Decoder DC1# converts inversely defect address FCA <1> to output a result of the inverse conversion as defect conversion address FCAE <1> in a case of a burst length 4 or 8.

For example, when a burst length is 4 or 8, that is when one of bust control signals MBL4 ad MBL8 is 1, a value of defect address FCA <1> is inversely converted. For example, if defect address FCA <1> is 0, defect conversion address FCAE <1> is inversely converted to 1. If defect address FCA<1> is 0, defect conversion address FCAE <1> is inversely converted to 1.

Figure 3:
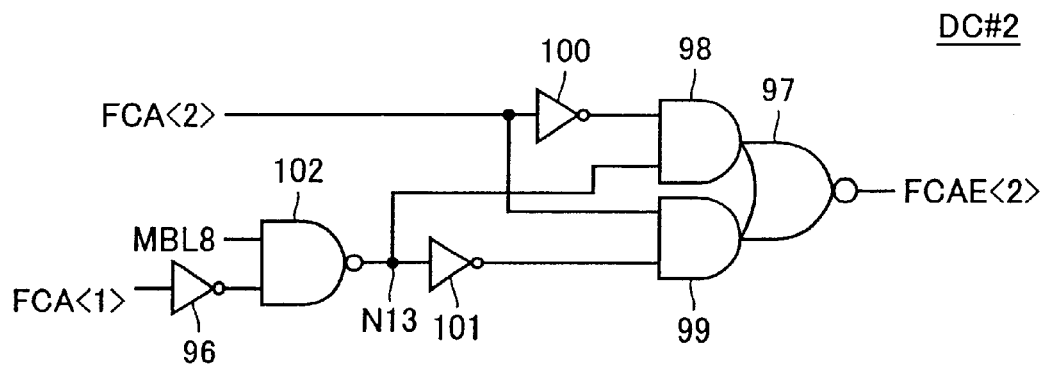
FIG. 3 is a circuit configuration diagram of a decoder converting inversely a defect address to a defect conversion address in a prescribed condition in a conversion circuit.

Referring to FIG. 3, decoder DC2# according to the first embodiment includes: a NAND circuit 102 receiving, as inputs, an inverted signal of defect address FCA <1> through an inverter 96 and burst control signal MBL8 to transmit a result of a NAND logical operation to a node N13; an AND circuit 98 receiving, as inputs, an inverted signal of defect address FCA <2> through an inverter 100 and a signal transmitted to node N13 to output a result of an AND logical operation; an AND circuit 99 receiving, as inputs, defect address FCA <2> and an inverted signal of a signal transmitted to node N13 through an inverter 101 to output a result of an AND logical operation; and a NOR circuit 97 receiving inputs from AND circuits 98 and 99 to output a result of a NOR logical operation as defect conversion address FCAE <2>.

Here, even-numbered address CAE <2> is converted when column address CA <1:0> in a prescribed condition. That is, conversion is performed due to carry-overs of column address CA <1> and CA <0>. Therefore, when even-numbered address CAE <2> is converted from column address CA <2>, column address CA <1> is also converted. Column address CA <1> having converted at this time assumes 0. This circuit converts inversely defect address FCA <2> when a bit corresponding to defect address FCA <1> is 0.

For example, inputted column address CA <2:0> is "011" from the upper bit side. Decoders DC1 and DC2 convert column address CA <2:0> such that even-numbered address CAE <2:0> assumes "100" from the upper bit side. In a case where defect address FCA <2:1> is set in correspondence to the converted even-numbered address, decoder DC2# converts defect address FCA <2> inversely according to an input of "10" from the upper bit side of FCA <2:1>. Column address CA <2:0> is "111" from the upper bit side. Decoders DC1 and DC2 convert column address CA <2:0> such that even-numbered address CAE <2:0> is "000" from the upper bit side. In a case where defect address FCA <2:1> is set in correspondence to the converted even-numbered address, decoder DC2# converts defect address FCA <2> inversely according to an input of "00" from the upper bit side of FCA <2:1>.

Figure 4:
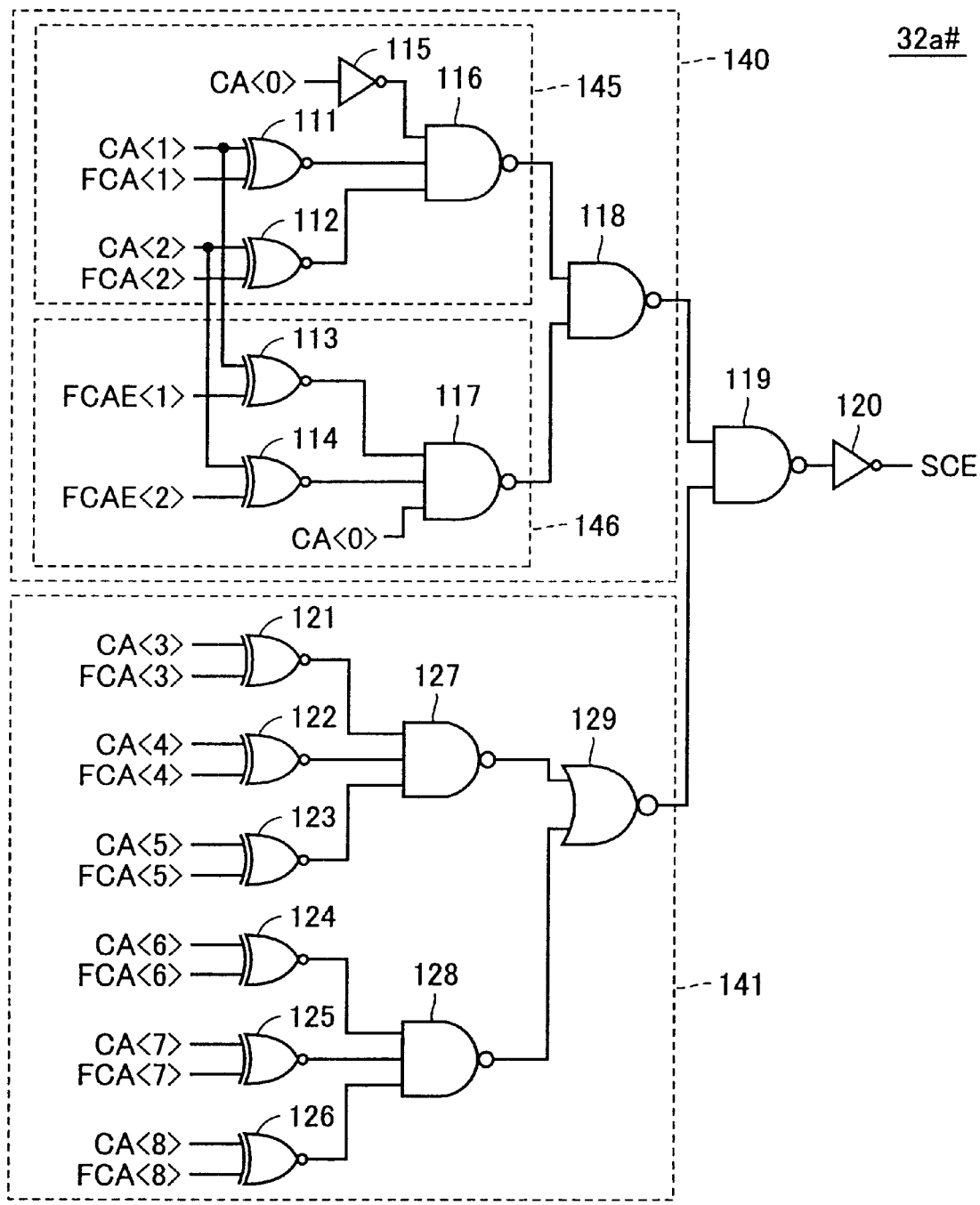
FIG. 4 is circuit configuration diagram of a comparison circuit.

Referring to FIG. 4, comparison circuit 32a# according to the first embodiment includes: lower bit determination unit 140 determining a defect in lower bits; an upper bit determination unit 141 determining a defect in upper bits; a NAND circuit 119; and an inverter 120. Lower bit determination unit 140 includes: a non-conversion determination unit 145 performing defect determination on the lower bits when column address CA is not converted in even-numbered address buffer 40; a conversion determination unit 146 performing defect determination on the lower bits when column address CA is converted in even-numbered address buffer 40; and a NAND circuit 118.

Non-conversion determination unit 145 includes: an exclusive NOR circuit 111 receiving, as inputs, column address CA <1> and defect address FCA <1> to output a result of an exclusive NOR logical operation; an exclusive NOR circuit 112 receiving, as inputs, column address CA <2> and defect address FCA <2> to output an result of an exclusive NOR logical operation; and a NAND circuit 116 receiving, as an input, an inverted signal of column address CA <0> through an inverter 115 and inputs from exclusive NOR circuits 111 and 112. Conversion determination circuit 146 includes: an exclusive NOR circuit 113 receiving, as inputs, column address CA <1> and defect conversion address FCAE <1> to output a result of an exclusive NOR logical operation; an exclusive NOR circuit 114 receiving, as inputs, column address CA <2> and defect conversion address FCAE <2> to output a result of an exclusive NOR logical operation; and a NAND circuit 117 receiving, as inputs, output signals of exclusive NOR circuits 113 and 114 and column address CA <0> to output a result of a NAND logical operation. NAND circuit 118 receiving, as inputs, a result of the determination of non-conversion determination unit 145 and a result of the determination of conversion determination unit 146 to output a result of a NAND logical operation to NAND circuit 119.

Upper bit determination unit 141 includes: an exclusive NOR circuit receiving, as inputs, column address CA <3> and defect address FCA <3> to output a result of an exclusive NOR logical operation; exclusive NOR circuits 122 to 126, in a similar manner, outputting respective results of exclusive logical operations on column addresses CA <4> to CA <8> and defect addresses FCA <4> to FCA <8> corresponding to respective column addresses CA <4> to CA <8>; a NAND circuit 127 receiving inputs from exclusive NOR circuits 121 to 123 to output a result of a NAND logical operation; a NAND circuit 128 receiving inputs from exclusive NOR circuits 124 to 126 to output a result of a NOR logical operation; and a NOR circuit 129 receiving inputs from NAND circuits 127 and 128 to output a result of a NOR logical operation. NAND circuit 119 receives, as inputs, a result of the lower bit determination and a result of the upper bit determination to output a result of a NAND logical operation to inverter 120 and inverter 120 inverts a signal outputted from NAND circuit 119 to generate defect determination signal SCE.

In a case where an input of column address CA <0> is 0, even-numbered address CAE is not converted; therefore, comparison determination is performed of defect addresses FCA <1> and FCA <2> before inverse conversion with column addresses CA <1> and CA <2>, respectively, using non-conversion determination unit 145.

In a case where an input of column address CA <0> is 1, even-numbered address CAE is converted; therefore, comparison determination is performed of defect addresses FCAE <1> and FCAE <2> after inverse conversion with column address CA <1> and CA <2>, respectively, using conversion determination unit 146.

That is, preset defect addresses and defect conversion addresses obtained by converting inversely the preset defect addresses are both inputted to comparison circuit 32a# and determination operations can be performed being switching between a case where column address CA is converted and a case where not converted when an even-number address is generated.

With such a configuration, since a defect address preset in a program circuit and column address CA can be compared with each other directly in a redundancy determination circuit without passing through address buffer 40, no delay arises in a determination operation accompanying a conversion operation of an even-numbered address buffer, thereby enabling performing high speed data reading.

SECOND EMBODIMENT

In the first embodiment, description is given of a configuration in which substitution is performed using a corresponding preset redundancy memory cell when a column address corresponding to a defective memory cell is inputted. Generally, in a case where many defects such as short-circuit occur in memory cells adjacent to a defective memory cell in each memory block, the memory cells adjacent to a defective memory cell are efficiently replaced simultaneously together with the defective memory cell.

It is an object of the second embodiment to, if one of prescribed two bit lines is a bit line corresponding to a defective memory cell, similarly replace the other bit line adjacent thereto with a redundant bit line corresponding to a redundant memory cell.

Description will be given, as one example, of a case where a prescribed pair of adjacent two bit lines among a plurality of bit lines is selected by each of upper bit CAE <8:2> and corresponding CAO <8:2> used in corresponding one of column decoders 3a and 3b, and one of two adjacent bit lines of the selected pair is selected by corresponding one of lower bit CAE <1> and CAO <1>.

To be concrete, redundancy determination is performed between the upper bit even-numbered address GAE <8:2> obtained after excluding the lower bit of even-numbered address CAE <1> and the upper bit defect address FCA <8:2> obtained after excluding the lower bit FCA <1> of defect address of a defective memory cell.

Figure 5:
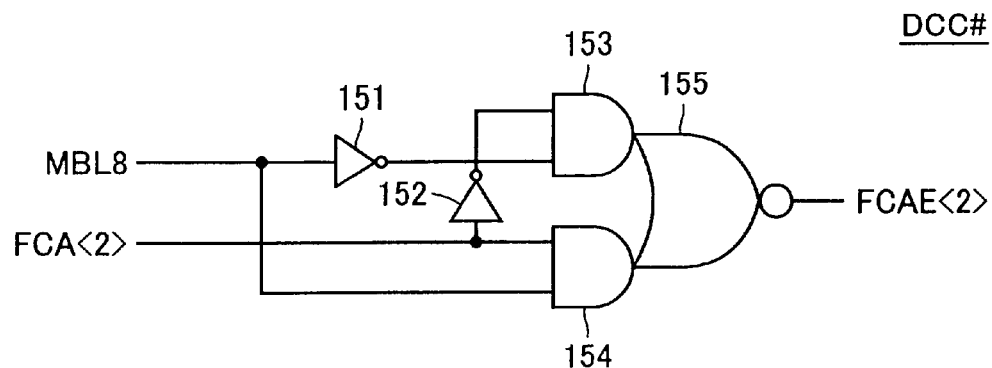
FIG. 5 is a circuit configuration diagram of decoder receiving a defect address input to convert the defect address to a defect conversion address according to a second embodiment.

Referring to FIG. 5, decoder DCC# according to the second embodiment includes: an AND circuit 153 receiving, as inputs, an inverted signal of burst control signal MBL8 through inverter 151 and an inverted signal of defect address FCA <2> through an inverter 152 to output a result of an AND logical operation; an AND circuit 154 receiving, as inputs, burst control signal MBL8 and defect address FCA <2> to output a result of an AND logical operation; and a NOR circuit 155 receiving input signals from AND circuits 153 and 154 to output a result of a NOR logical operation as defect conversion address FCAE <2>.

In a case where a burst length is 8, defect address FCA <2> is inversely converted. For example, if defect address FCA <2> is 0, it is inversely converted to 1. If defect address FCA <2> is 1, it is inversely converted to 0. Note that since defect address FCA <1> is not subjected to coincidence comparison in a comparison circuit, no necessity arises for inverse conversion.

Figure 6:
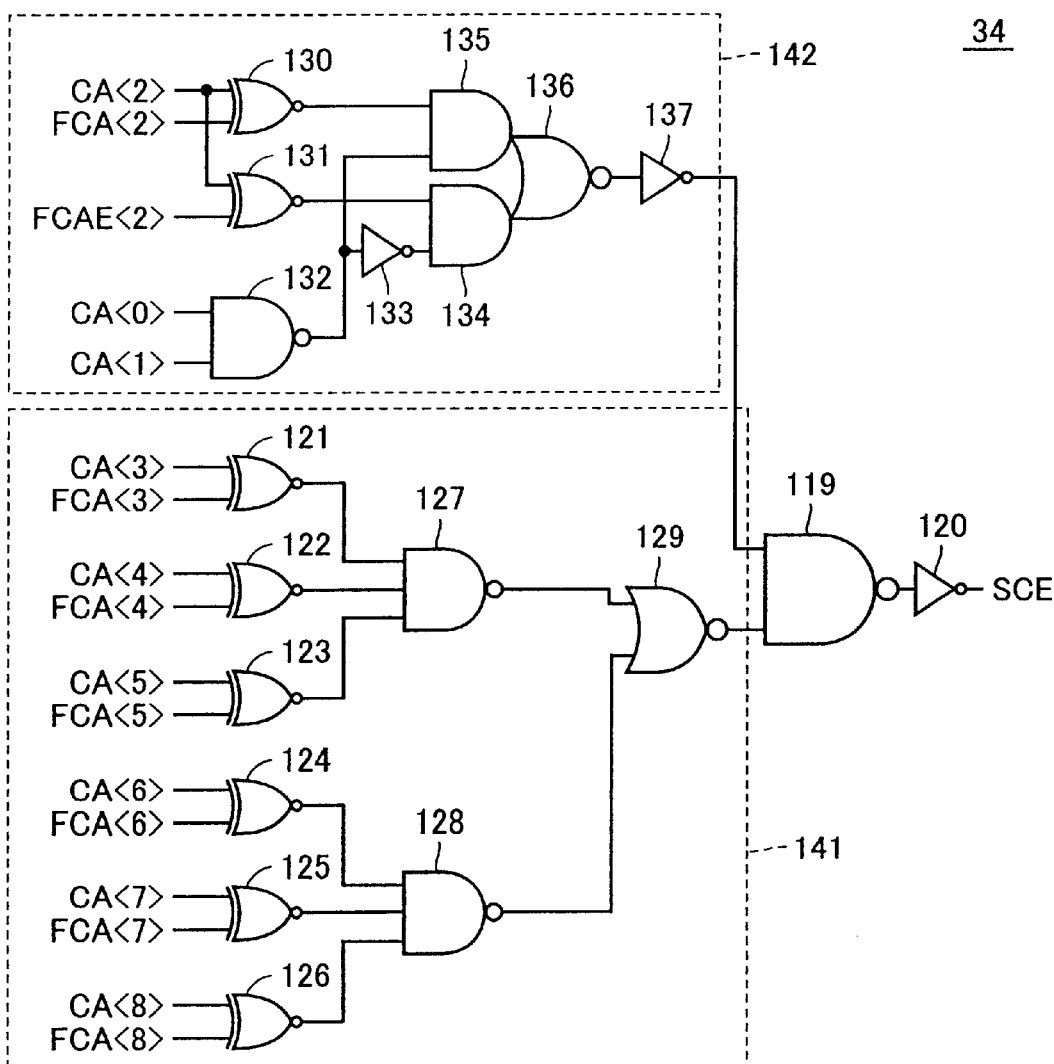
FIG. 6 is a circuit configuration diagram of a comparison circuit according to the second embodiment.

Referring to FIG. 6, comparison circuit 34 according to the second embodiment is different in comparison with comparison circuit 32b# of the first embodiment in an aspect that lower bit determination unit 140 is replaced with a lower bit determination unit 142. The other aspects are similar, so none of descriptions is repeated.

Lower bit determination unit 142 includes: an exclusive NOR circuit 130 receiving, as inputs, column address CA <2> and defect address FCA <2> to output a result of an exclusive NOR logical operation; an exclusive NOR circuit 131 receiving, as inputs, column address CA <2> and defect conversion address FCAE <2> to output a result of an exclusive NOR logical operation; a NAND circuit 132 receiving, as inputs, column addresses CA <0> and CA <1> to output a result of a NAND logical operation; an AND circuit 135 receiving inputs from exclusive NOR circuit 130 and NAND circuit 132 to output a result of an AND logical operation; an AND circuit 134 receiving an input from exclusive NOR circuit 131 and as input, a inverted signal of an output signal from NAND circuit 132 through an inverter 133 to output a result of an AND logical operation; a NOR circuit 136 receiving inputs from AND circuits 134 and 135 to output a result of a NOR logical operation; and an inverter 137 outputting an inverted signal of an output signal of NOR circuit 136 as a result of the lower bit determination.

Lower bit determination unit 142 compares column address CA directly with defect address FCA in a case where column address CA <2> is not converted, while in a case where column address CA <2> is converted in a prescribed condition, comparison is performed between defect conversion address FCAE <2> obtained by inverse conversion and column address CA <2>. The prescribed condition here is a case where column address CA <1:0> is "11" from the upper bit side.

The above description applies to upper bit determination unit 141 in a similar manner.

With the configuration adopted, column addresses CA <2> to CA <8> of upper bits obtained after excluding column address CA <1> before passage through a even-numbered buffer are compared with defect addresses FCA <2> to FCA <8>, thereby performing a redundancy determination operation.

If a coincidence arises, a column select operation for a redundancy memory cell is performed on the basis of a column address inputted to a redundancy decoder by defect determination signal SCE.

For example, a case is considered where column selection is performed of one bit line among 256 bit lines with even-numbered address CAE <8:1>. Prescribed two adjacent bit lines to each other are selected by even-numbered CAE <8:2> and one of the prescribed two adjacent bit lines is selected on the basis of a bit of even-numbered address CAE <1>. Then, when redundancy determination is performed, if even-numbered address CAE <8:2> coincides with defect address FCA <8:2> programmed in advanced, defect determination signal SCE is outputted. Therefore, a bit line of an adjacent memory cell having the same upper bits as a defect address, other than the lower bits thereof, is replaced with a redundant bit line.

With the configuration adopted, a redundancy determination signal is also outputted when access is tried to get to a memory cell adjacent to a bit line having a defective memory cell and a redundant bit line corresponding to a redundancy memory cell is selected and used for substitution, thereby enabling efficient improvement on increase in a yield.

Note that while in the above embodiment, description is given with a synchronous semiconductor memory device as a precondition, the present invention is not limited to this, but can also be applied to other configurations of semiconductor memory device in similar manner.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a plurality of memory cells arranged in a matrix;
   at least one redundant memory cell column for being substituted for a memory cell column having a defective memory cell among a plurality of memory cell columns for the sake of saving;
   an address conversion circuit receiving an address signal of L bits (where L is an integer of 2 or more) for selecting said plurality of memory cell columns to apply a prescribed conversion operation to a part-bit having at least one bit among said L bits when necessary;

a defect address conversion circuit receiving a defect address signal of L bits, stored in advance, and corresponding to the memory cell column having said defective memory cell to apply an inverse conversion operation, exercised by inverting a relationship between an input and output in said prescribed conversion operation applied by said address conversion circuit, to said part-bit of said defect address signal;

an address comparison circuit comparing said address signal before passage through said address conversion circuit and said defect address signal after passage through said defect address conversion circuit with each other; and a select circuit getting access to one of a memory cell column corresponding to said address signal after passage through said address conversion circuit and said redundant memory cell column according to a result of comparison in said address comparison circuit.

2. The semiconductor memory device according to claim 1, wherein said address comparison circuit further receives, as an input, said defect address signal before passage through said defect address conversion circuit, said address conversion circuit applies said prescribed conversion operation to said address signal when a prescribed condition is met, said defect address conversion circuit applies said inverse conversion operation to said defect address signal when said prescribed condition is met, said address comparison circuit compares a defect address signal after said inverse conversion operation and said address signal before passage through said address conversion circuit with each other when said prescribed condition is met, while when said prescribed condition is not met, comparing said defect address signal before passage through said defect address conversion circuit and said address signal before passage through said address conversion circuit with each other.

3. The semiconductor memory device according to claim 2, wherein said address conversion circuit determines said prescribed condition on the basis of said part-bit.

4. The semiconductor memory device according to claim 1, further comprising a burst counter counting up sequentially said part-bit of said address signal when a burst reading is instructed.

5. The semiconductor memory device according to claim 1, wherein one of plurality of memory cell column pairs each constituted of two adjacent memory cell columns to each other among said plurality of memory cell columns is selected according to an address signal of (L−1) bits obtained after excluding a prescribed 1 bit from said L bits after passage through said address conversion circuit, one of two adjacent memory cell columns to each other constituting said selected memory cell column pair is selected according to an address signal of said prescribed 1 bit after passage through said address conversion circuit, said prescribed 1 bit being one of said part-bit among said L bits, said address comparison circuit receives an address signal of (L−1) bits obtained after excluding said prescribed 1 bit from said L bits before passage through said address conversion circuit and said defect address signal of said (L−1) bits obtained after excluding said prescribed 1 bit after passage through said defect address conversion circuit to compare them with each other, and said select circuit gets access to said at least one redundant memory cell column according to said prescribed 1 bit when a result of comparison in said address comparison circuit shows coincidence.

* * * * *